United States Patent [19]

Roemer et al.

[11] Patent Number: 4,910,462
[45] Date of Patent: Mar. 20, 1990

[54] ETCHED Z-AXIS GRADIENT COILS FOR NMR SYSTEM

[75] Inventors: Peter B. Roemer; William A. Edelstein, both of Schenectady, N.Y.

[73] Assignee: General Electric Company, Schenectady, N.Y.

[21] Appl. No.: 344,642

[22] Filed: Apr. 28, 1989

[51] Int. Cl.$^4$ ............................................. G01R 33/20
[52] U.S. Cl. ...................................... 324/318; 324/322
[58] Field of Search ...................... 335/299, 301, 213; 324/300, 307, 309, 318, 319, 322

[56] References Cited

U.S. PATENT DOCUMENTS

| | | | |
|---|---|---|---|
| 4,728,895 | 3/1988 | Briguet | 324/318 |
| 4,791,370 | 12/1988 | Mackinnon | 324/318 |
| 4,794,338 | 12/1988 | Roemer et al. | 324/318 |

Primary Examiner—Michael J. Tokar
Attorney, Agent, or Firm—Geoffrey H. Krauss; James C. Davis, Jr.; Marvin Snyder

[57] ABSTRACT

An etched coil for producing a Z-axis magnetic field gradient responsive to flow of a current I, has a number N of pairs of elongated conductive strips, with each strip of a pair being positioned substantially symmetrically about a central insulative cutline, and insulatively spaced from all other strips, and with a first strip being insulatively severed into first and third strip portions; the strips are connected so that current flows into a first one of said strips and then between each successive pair of the strips until the current flows out of a last one of the strips. There are interconnectors used, in each i-th pair, where $1 < i < N$, to connect a first end of a first strip of that pair to a substantially-symmetrically disposed first end of a second strip of that pair, and also to connect a second end of the second strip of that pair to a substantially-symmetrically disposed end of the third portion of that pair; these interconnectors are positioned adjacent to one another and, when the strips are rolled into a substantially cylindrical form, will radially overlap in the $\theta$ direction of the resulting coil, so that a magnetic field due to flow of the current in any one of the first interconnectors will be substantially cancelled by another magnetic field due to flow of the same current in a corresponding one of second interconnectors.

19 Claims, 8 Drawing Sheets

ETCHED Z-AXIS GRADIENT COILS FOR NMR SYSTEM

BACKGROUND OF THE INVENTION

The present invention relates to Z-axis gradient coils for use in a nuclear magnetic resonance (NMR) system and, more particularly, to novel Z gradient coils fabricated from etched conductors on an insulative substrate, and eliminating the need for winding machines or multiple connection soldering.

A NMR system typically requires that gradient magnetic fields be provided along each of the three orthogonal axes of a Cartesian coordinate system. Typically, each magnetic field gradient is provided by a different coil, or coil set. In a system wherein the static magnetic field $B_0$ is provided in the axial Z direction, the coils for providing a gradient in the transverse (X-Y) direction are relatively easily fabricated by etching a particular pattern onto a copper circuit board, which is then bent into the form of a cylinder for lining the bore of a $B_0$-generating main magnet. However, the coil, or coil set, for generating the Z-axis magnetic field gradient has typically been fabricated of separate wires, wound on a special winding machine; it was previously thought to be topologically impossible to make the Z-gradient winding from copper circuit board without requiring multiple solder connections to complete the circuit in a circumferential direction. From a manufacturing viewpoint, it is obviously desirable to be able to fabricate all three gradient windings by the same method; this is particularly true of sets of gradient coils for small bore NMR systems, where precision positioning of, and soldering between, ever-smaller wire conductors is difficult and the cost of etched coils is, due to the smaller size, no longer an issue. It is therefore highly desirable to provide an etched conductor Z-gradient field-producing winding, or winding set.

BRIEF SUMMARY OF THE INVENTION

In accordance with the invention, n etched Z-axis magnetic field gradient-producing winding comprises: a plurality N of pairs of elongated conductive strips, each strip of a pair being positioned substantially symmetrically about a central insulative cutline, and insulatively spaced from all other strips, with a first strip being insulatively severed into first and third strip portions; conductive means for enabling said current to flow into a first one of said strips and then between each successive pair of said strips, until said current flows out of a last one of said strips; and first means for interconnecting, in each i-th air, where $1 \leq i \leq N$, a first end iv of a first strip of that pair to a substantially-symmetrically disposed first end iw of a second strip of that pair; and second means for interconnecting, in each i-th pair, a second end iv of the second strip of that pair to a substantially-symmetrically disposed end iz of the third portion of that pair; said first and second interconnecting means being positioned adjacent to one another and, when said strips are rolled into a substantially cylindrical form with said iv end adjacent to said 21-iz end and said iw end adjacent to said iv end, radially disposed to overlap in the $\theta$ direction of the resulting coil and with a magnetic field due to flow of said current in any one of aid first interconnecting means being substantially cancelled by another magnetic field due to flow of the same current in a corresponding one of said second interconnecting means.

In a presently preferred embodiment, the first interconnecting means comprises a first set of arcuately-shaped interconnectors, and the second interconnecting means comprises a second set of interconnectors each with a shape which is te subtractive inverse of an associated interconnector of the first set.

Accordingly, it is an object of the present invention to provide a novel etched-conductor Z-axis gradient magnetic field-producing winding, or winding set, for use in a nuclear magnetic resonance system. This and other objects of the present invention will become apparent upon reading of the following detailed description, when considered in conjunction with the drawings.

DETAILED DESCRIPTION OF THE INVENTION

Figure 1:
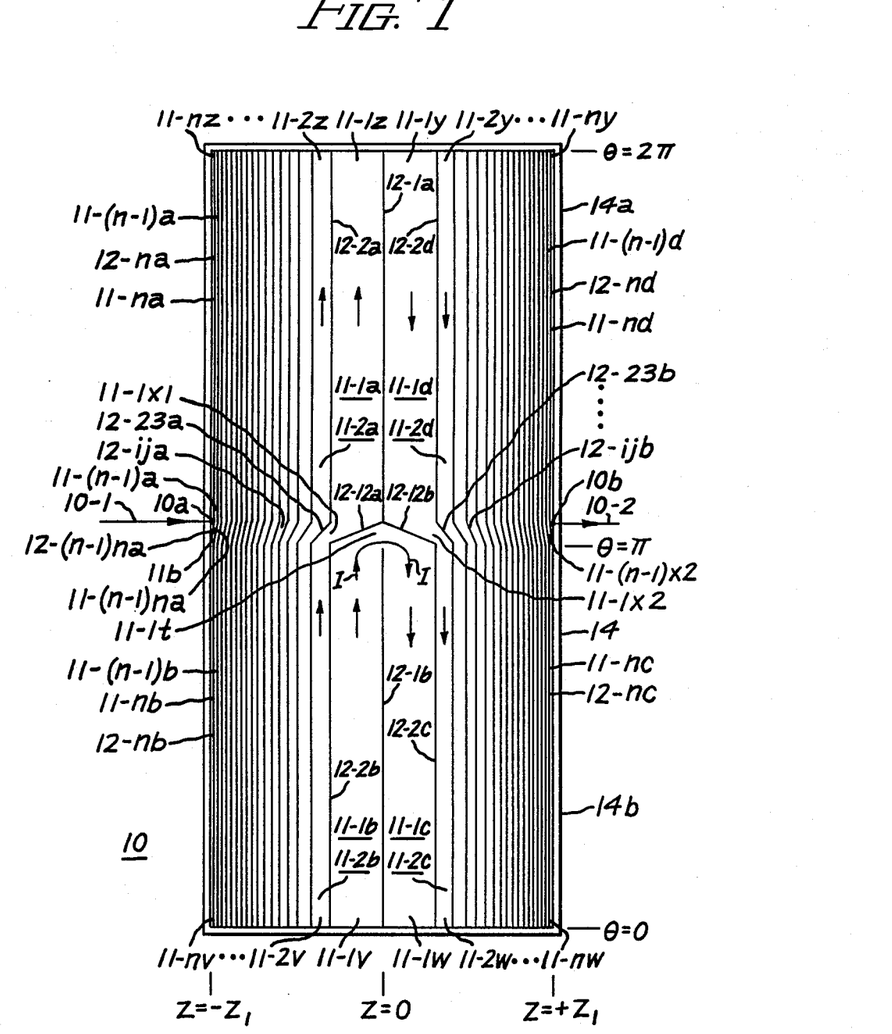
FIG. 1 is a plan view of an early attempt at an etched Z-gradient coil, prior to wrapping of the etched conductor into cylindrical form.

Referring initially to FIG. 1, an earlier one of our Z-axis gradient coils was fabricated utilizing an initially planar conductive sheet 10 having a number of conductive strips 11, separated one from the other by insulative cutlines 12, all supported by a common insulative substrate 14. Th rectangular sheet 10 was cut into a pattern substantially symmetric about the centerline along which an upper cutline 12-1a and a lower central cutline 12-1b extend from the sheet top and 14a to the sheet bottom end 14b. A common coil current I enters a first coil end 10a through a first common lead 10-1, at that end of a left-most strip 11-na which extends from the sheet center ($\theta = \pi$) upwardly towards sheet end 14a. When the sheet is rolled into cylindrical form, with end 14a adjacent to end 14b, the first conductive strip end 11-nz will be joined to the adjacent end 11-nv of the n-th second conductor strip 11-nb and current will flow upwardly through strip 11-nb, through a transition portion 11-(n−1)x1 and into a first conductive strip 11-(n−1)a of the next right-ward loop. An insulative cutline 12-(n−1)na is therefore formed between first loop upper portion 11-na and its lower portion 11-nb, just as an insulative cutline 12-na is formed between the first second loop upper portions 11-na and 11-(n−1)a, respectively, and another insulative cutline 12-nb is formed between the first and second conductive loop lower strips 11-nb and 11-(n−1)b This set of conductive loops, strips and attachments between ends 11-iz and 11-iv, where $1 \leq i \leq n$, continues toward the center of the sheet. Thus, end 11-2z is to be connected to strip end 11-2v so that current can flow upwardly through strip 11-2b, through transition region 11-1x1 and into first loop first strip 11-1a. The current then must be connected from end 11-1z to end 11-1v, and flows through lower strip 11-1b turning 180° in the central transition 11-1t, and then flowing downwardly through first loop righthand lower strip 11-1c, until end 11-1w is reached. End 11-1w is to be connected to end 11-1y, so the current can flow through first loop fourth strip 11-1d, through transition 11-1x2 and into the right-ward strips of the remaining loops. Current finally flows through the next-to-last loop upper portion 11-(n−1)d, through the transition 11-(n−1)x2, into right-most loop lower strip 11-nc, from whose end 11-nw the current is to be connected to end 11-ny of the right-most loop upper strip 11-nd; it is at the end 10b of this strip that the common current flows out of the coil through coil lead 10-2.

Figure 1A:
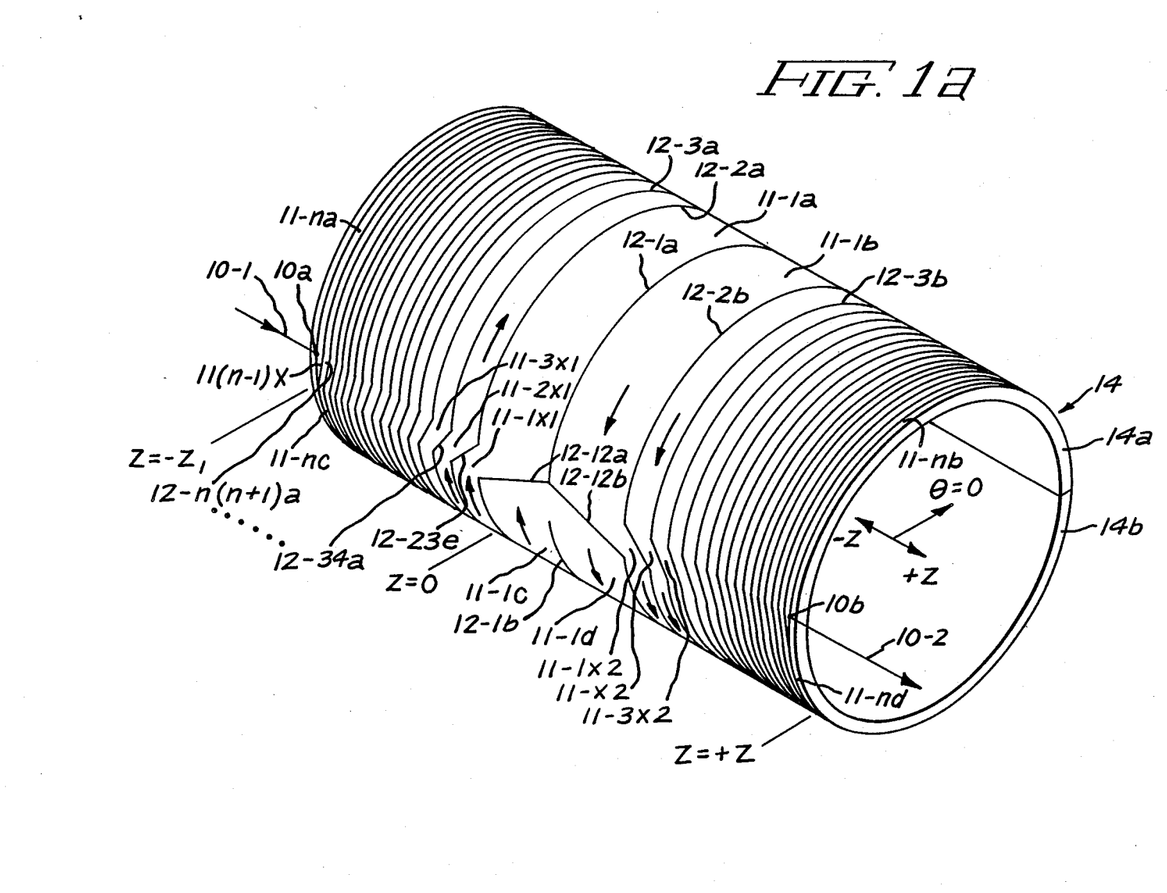
FIG. 1a is a perspective view of the sheet conductor of FIG. 1, after formation into a cylinder.
Figure 1B:
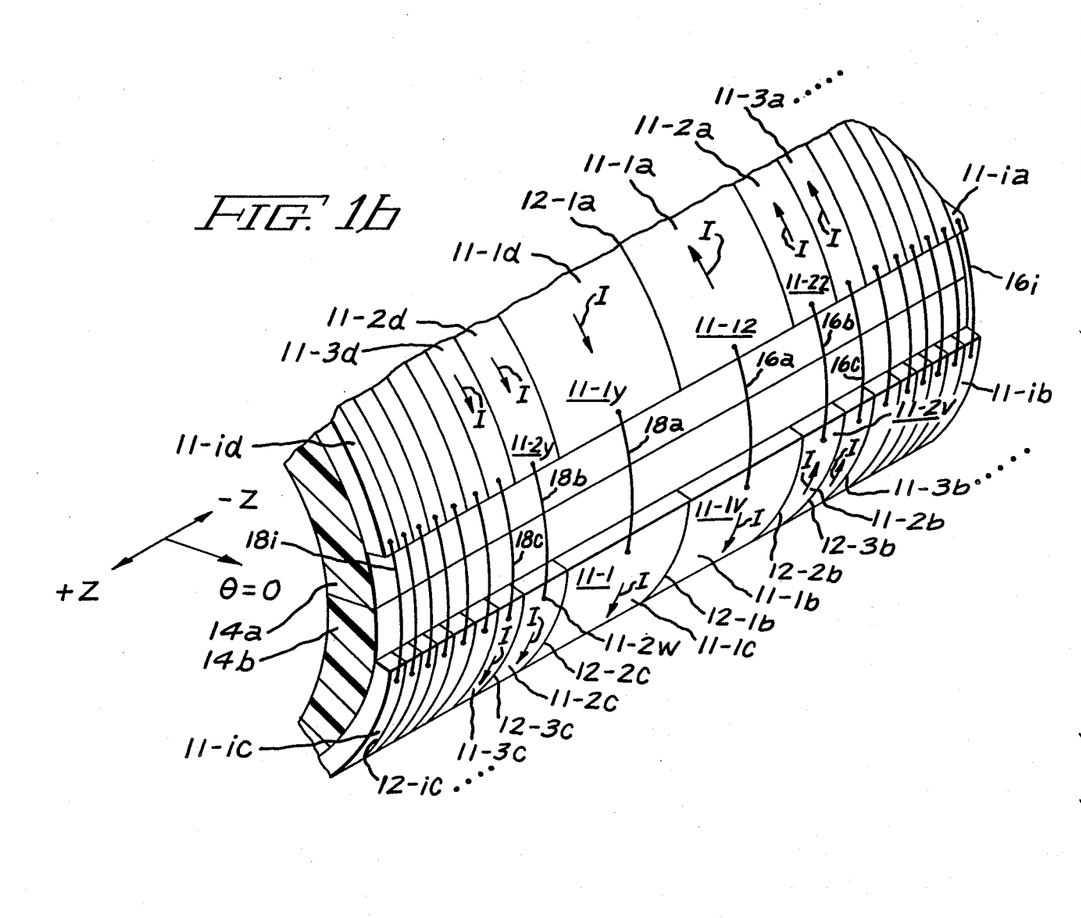
FIG. 1b is a perspective view showing the abutting end portions of the cylindrical coil of FIG. 1a, and illustrates a persistent problem thereat.

Referring now to FIGS. 1a and 1b, when the initially-planar cut conductive sheet 10 is rolled into a cylinder, with substrate ends 14a and 14b abutted against one another, the loop first strips 11-ia are connected at the ends 11-iz thereof via first conductive jumpers 16i, to the end 11-iv of the loop second conductive portion 11-ib. Similarly, on the other side of the centerline, another jumper 18-i connects an end 11-iw of a loop third strip 11-ic to an associated end 11-iy of a loop fourth strip 11-id. It will be seen that there are thus 2n separate jumpers 16/18, each requiring at least a pair of separate conductor-conductor fastenings (as by soldering, welding and the like), so that the 2n conductive jumpers require 4n separate fastening operations. In order to maintain uniformity of the desired gradient field, each of the connective leads 16/18 must be precisely placed with respect to the other conductive lead of that pair (i.e. to that lead at the same distance from the coil axial (z=0) centerline). These leads are located in a relatively small volume, which may be even further reduced as the size of the gradient coil is itself reduced. If the etched Z-axis gradient coil is one of a pair of such coils in a self-shielded Z-axis gradient coil set, than even less volume is available for interconnection 16/18 in each coil. We therefore desire a Z-axis gradient coil which is fabricable with etched windings that do not require soldered loop-end or intermediate connections to complete the electrical circuit in the circumferential ($\theta$) direction.

Figure 2:
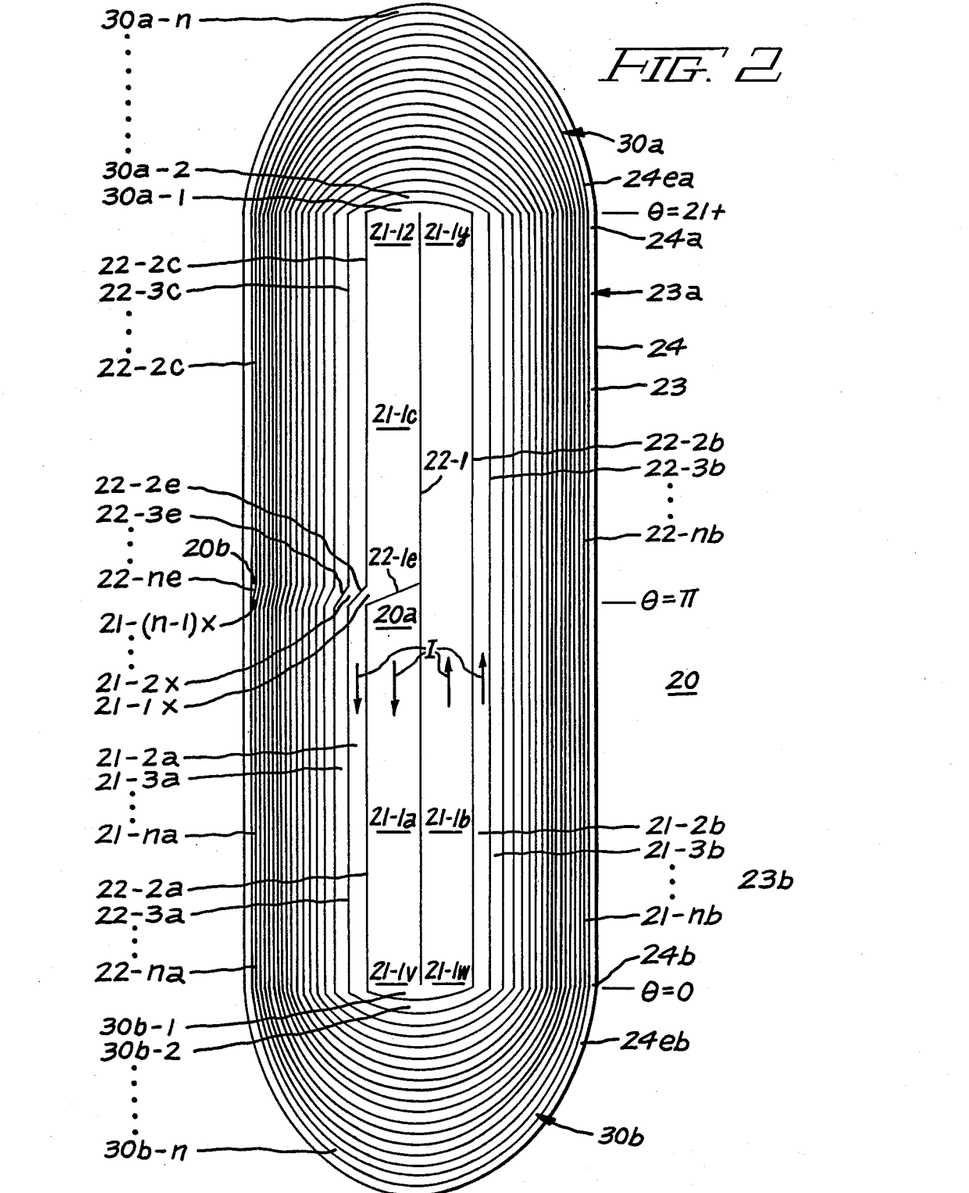
FIGS. 2, 2a and 2b are, respectively, a plan view of an etched conductor, a perspective view of a cylinder-wrapped etched winding, and an end view of the wrapped winding, illustrating one presently preferred embodiment of the present invention.
Figure 2A:
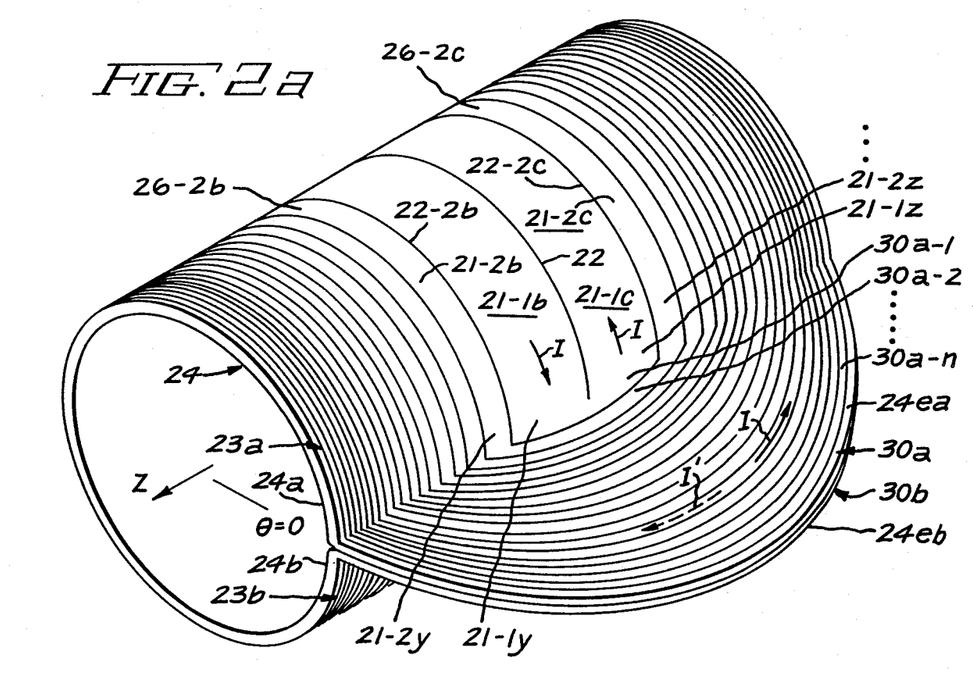
Figure 2B:
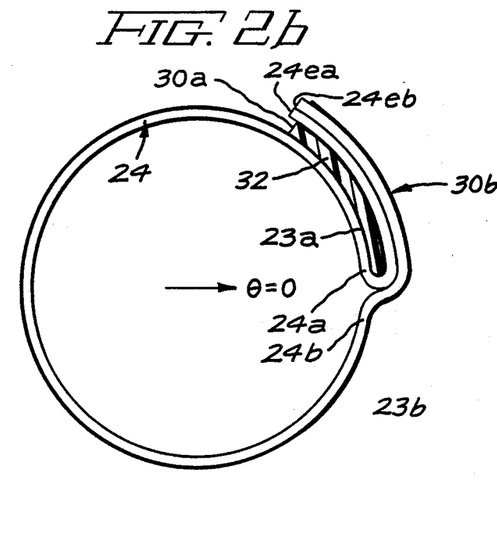

Referring now to FIGS. 2, 2a and 2b, one embodiment of our etched Z-axis gradient coil uses an etched conductive sheet 20 (FIG. 2). The sheet comprises a plurality of conductive strips 21, each separated from the others by at least one insulative cut line 22. The totality of conductors are supported by an insulative substrate 24, having a first end 24a and a second, opposite end 24b. The coil, when finally fabricated, is of cylindrical geometry, and so is described in terms of cylindrical coordinates, with axial coordinate Z having a zero value at the center (denoted by cut line 22-1) and extending in the negative direction to a maximum distance of $Z_{-m} = -Z_1$ and in the positive direction to a maximum distance $Z_{+m} = +Z_1$. In the angular direction, the angular coordinate $\theta$ will go from zero to $2\pi$; when the conductive sheet 20 is originally fabricated, in planar form, one end, at $\theta = 0$, will be at a first end of the substrate, e.g. end 24b, while the furthest end, with angle $\theta = 2\pi$, is at the opposite substrate end, e.g. end 24a. Advantageously, conductive strips 21 are substantially symmetrically placed about the central cutline 22-1, in our novel coils. A common coil current I flows through each conductive strip. Each strip 21-i, where $1 \leq i \leq n$, and whether a "left-hand" strip (i.e. a "broken strip" of portions 21-ia and 21-ic) or a "right-hand" strip (i.e. an "unbroken" strip of portions 21-ib), will be at a like distance from center cutline 22-1, and is here considered part of the same loop of the coil; thus, the first loop (starting at a first coil end 20a) has a first portion 21-1a (immediately to the left of center cutline 22-1 and directed towards lower end 24b), a second portion 21-1b (immediately to the right of center cutline 22-1 and extending from lower end 24b to upper end 24a) and a final third portion 21-1c, of the same width as portions 21-1a and 21-1b, and completing the left-end section (from upper end 24a to the central end of first portion 21-1a). The first loop lower portion 21-1a is separated from the second loop lower portion 21-2a by another cutline 22-2a, while the first loop second portion 21-1b is separated by cutline 22-2b from the second loop second portion 21-2b. Similarly, the first loop third portion 21-1c is separated from the second loop third portion 21-2c by a cutline 22-2c. The first and third portions of the first loop are themselves separated by an insulative cutline 22-1e, just as the second loop first and third portions 22-2a and 22-2c, respectively, are separated from each other by a second loop cutline portion 22-2e. The end of the first loop third portion 21-1c, nearest to the first portion 21-1a of that loop, transitions to the beginning of the second loop first portion 21-2a in a transition portion 21-1x. The extent of portions 21-ia and 21-ic can be varied to vary the location of transition 21-ix to be anywhere along the left-hand strip; likewise, the "broken" and "unbroken" strip positions can be reversed, as may be required. Each j-th remaining one, where $3 \leq j \leq n$, of the N loops consists of a first portion 21-ja, a second portion 21-jb, a third portion 21-jc, and a transition region 21-jx to the next (the j+i-th) outwardly-disposed loop, until the coil second connection 20-b is reached at the end of the n-th loop third portion 22-nc. One of a pair of separate conductive leads (not shown) respectively connect to an associated one of coil first end 20a or coil second end 20b.

The flat conductive sheet 20 is rolled, in the $\theta$ direction, into a cylindrical coil (FIG. 2a). In order to have the single coil current I flowing through each of the coil turns (where each coil loop now effectively forms a pair of turns, each equally spaced from the coil centerline at the central cutline 22-1). The complete etched sheet 20 comprises the central etched portion 22, having first portion end 22a and second portion end 22b and connective extensions 30a/30b, all supported upon the insulative substrate 24. We have found that, the net current in the $\theta$ direction is zero in the end regions, so that we can extend both ends of the pattern with substantially mirror-imaged conductor extension sets 30a and 30b and return the current in the $\theta$-z plane. Each end extension 30a or 30b is supported by an underlying one of extension 24ea or 24eb, respectively, of the underlying insulative substrate 24. The open end 21-1v of the first loop first portion 21-1a is thus integrally connected to a first end of a first arcuate-shaped interconnective portion 30b-1, which has its other end integrally connected to the lower end 21-1w of first loop second portion 21-1b. Similarly, the opposite end 21-1y of portion 21-1b is integrally connected to a first end of a similarly arcuate-shaped interconductor 30a-1, having its second end connected to the open end 21-1z of first loop third portion 21-1c. Similar first interconductor portions 30b-2, ..., 30b-n interconnect the "v" ends of the first portions 21-2a, ..., 21-na of each of the remaining loop first portions and the adjacent open "w" end of the second portions 21-2b, ..., 21-nb of that loop; similarly, at the other end 30a, other interconductors 30a-2, ..., 30a-n interconnect the remaining open "y" and of each loop second portion 21-2b, ..., 21-nb to the open "z" end of the corresponding loop third portion 21-2c, ..., 21-nc.

When the flexible conductive etched winding and its underlying insulative substrate are rolled into a cylindrical coil (FIG. 2b) with winding end region 23a adjacent to end region 23b, one substrate extension 24ea is generally radially extended from the cylinder and is adjacent to the other generally-radially-extended substrate extension 24eb; the interconnectors 30a are situated adjacent to, but insulatively separated from interconnectors 30b, so that the magnetic field due to the flow of the common current I in each interconnector 30a is essentially cancelled by the magnetic field due to the same common current I' (shown in broken line) flowing in the opposite direction in the immediately-adjacent interconnectors 30b. Since the overlapping interconnectors 30a and 30b are placed adjacent to one another, the total magnetic field created by the end turns cancel one another, as will occur for any end-turn path, even if not semicircular, or semi-oval as illustrated, as long as end-turn portions 30a and 30b are mirror images of one another, and are positioned at opposite ends of the unfolded (planar)coil, so as to overlap. When the sheet is formed into a cylinder. As shown in FIG. 2b, the overlapped end-turn portions 30a/30b, having a net zero magnetic field, can now be folded to lie parallel to, but insulatively spaced from, a portion of the cylindrical coil surface. Optionally, an additional thin insulative member 32 can be inserted in between coil conductor portions 21a and end-turn conductor portions 30a.

It should be pointed out that the particular gradient coil conductor dimensions (number, size, width, etc.) depend upon the selected gradient coil current flow patterns, or current streamlines, and each gradient coil design thus depends upon a number of parameters (such as linearity, gradient strength, inductance, maximum current density and shielding—in the case of shielded gradient coils), which are selected in manner now well known to the art. By way of illustration only, we use herein a common set of conductors 21 for realizing a selected Z-gradient field; a particular z-gradient current density, in the $\theta$ direction, has been selected to have a linear plus a quadratic variation between the axial limits $-Z_1 \leq Z \leq +Z_1$. In particular, this illustrative current density can be expressed in turns of the stream function S having a relationship to the current density J, as given by $$J_\theta(\theta, Z) = -\frac{\partial S(\theta, Z)}{\partial Z} \quad (1)$$

where the stream function has the property that all lines of constant S are parallel to current I flow. For a selected current density in the form of a quadratic plus a linearly increasing term, the stream function S and current density J may be written as:

$$S(\theta, z) = \frac{NI}{(1+b)} \left( 1 + b - \left[\frac{z}{z_1}\right]^2 - b \left|\frac{z}{z_1}\right|^3 \right) \quad (2)$$

$$J_\theta(\theta, z) = \frac{2NIz}{(1+b)z_1^2} \left( 1 + \frac{3}{2} b \left|\frac{z}{z_1}\right| \right) \quad (3)$$

where N is the number of turns in either half (i.e. to the left, or to the right, of center cutline 22-1) of the coil, I is the coil current and b is a dimensionless parameter whose value determines the ratio of linear to quadratic increasing current density. It will be seen that at the coil center, with $Z=0$, equation 2 has a maximum value of NI(which is the total ampere-turns on one-half of the coil) while at either end, with $Z=|Z_1|$, equation 2 has a value of zero. FIG. 1 is effectively a plot of equation 2 for $(N+1)=19$ contour values ranging from zero to (NI) and with $b=3.28$. Thus, there are 18 cutlines 22 between the contours 21, on each side of central cutline 22-1, with each conductor 21 having the constant total current I flowing therein.

Figure 3:
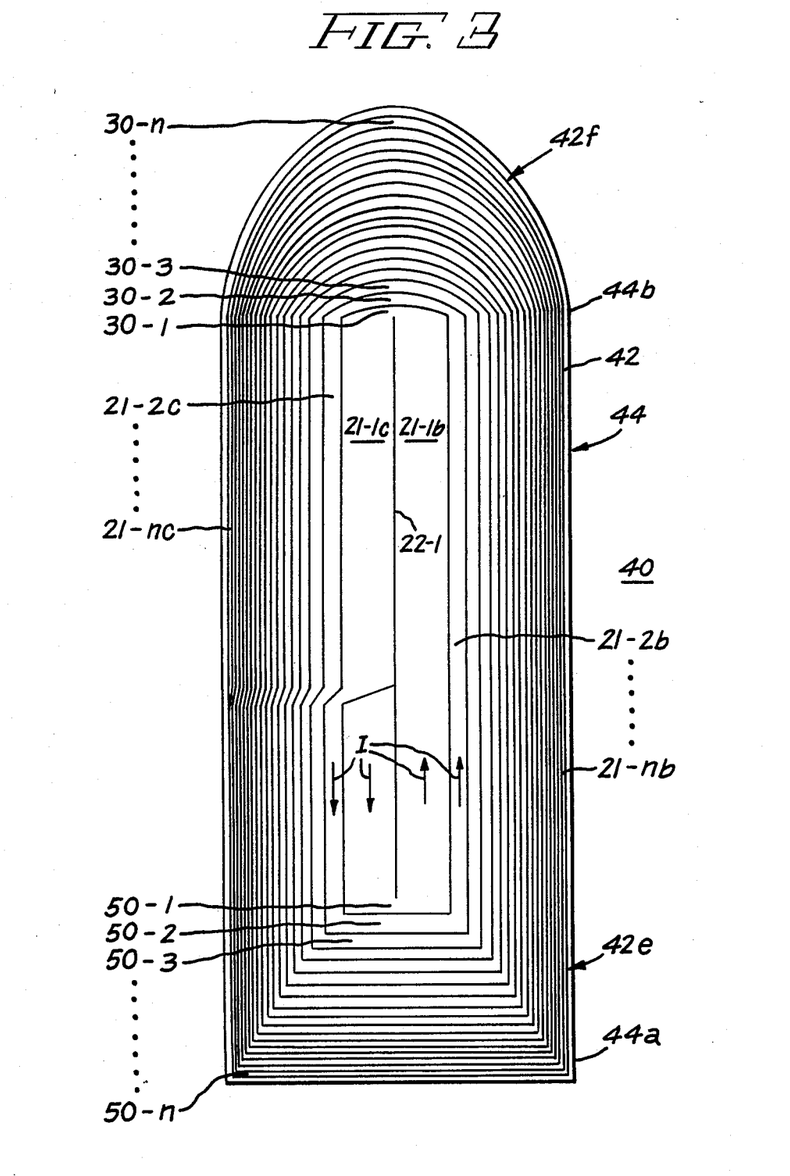
FIGS. 3 and 3a are, respectively, a plan view of an unwrapped etched winding and an end view of the wrapped winding, illustrating a presently most preferred embodiment of the present invention.
Figure 3A:
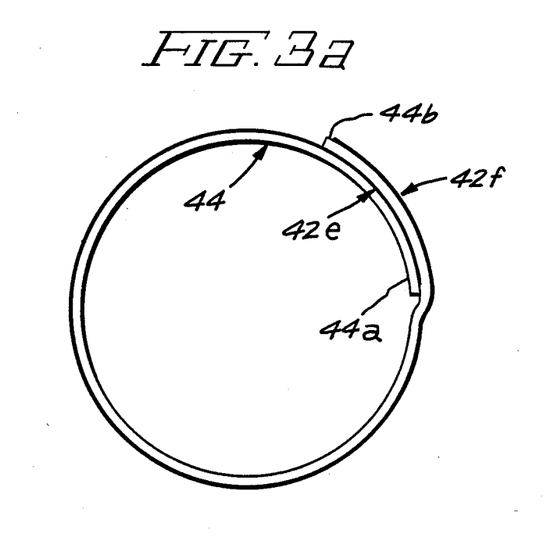
Figure 3B:
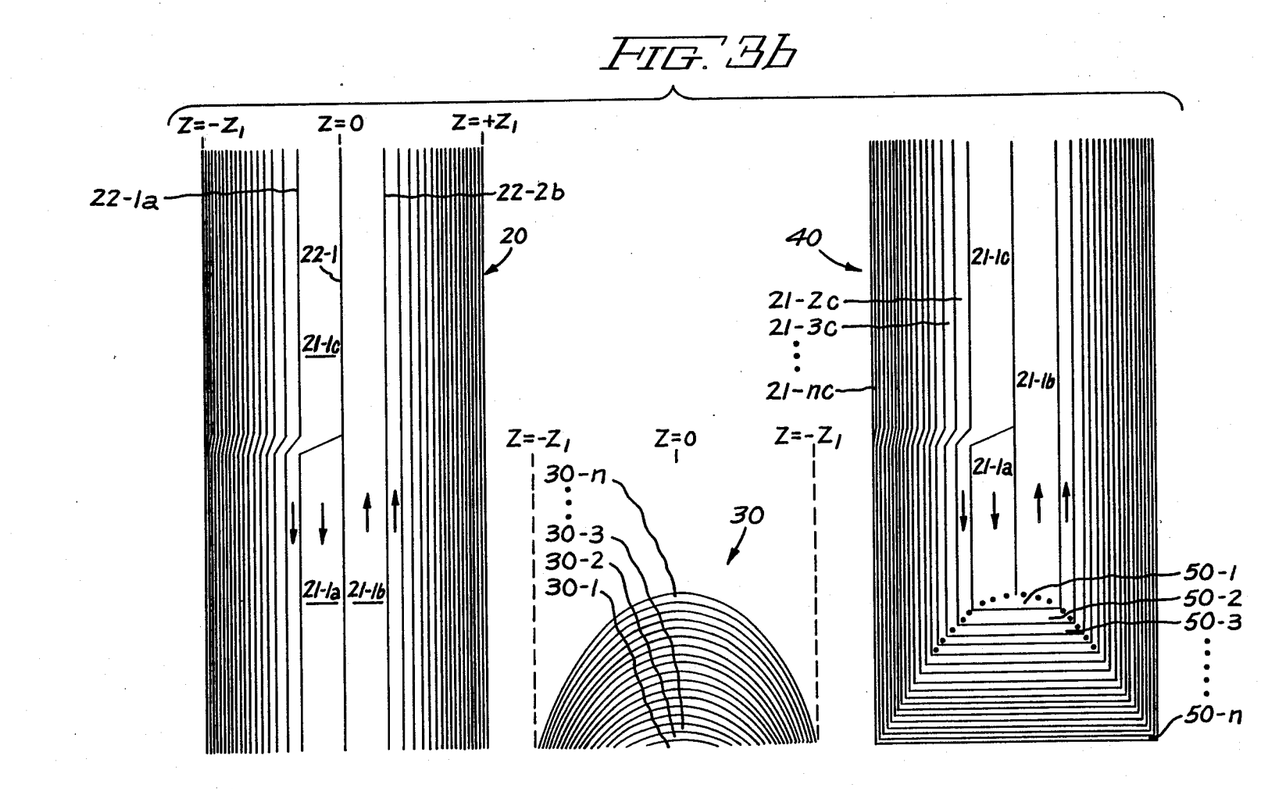
FIG. 3b is a graphical illustration of the manner in which the current distribution for the overlapped end of the coil of FIG. 3 and 3a may be obtained, and useful in appreciating aspects of the present invention.

Referring now to FIGS. 3 and 3a, our presently most-preferred Z-axis gradient coil embodiment uses a flexible etched winding sheet 40 which is of a shape to alleviate the need for a separate insulative sheet 32, by having a single overlapping coil portion, utilizing the insulative properties of the underlying substrate to prevent short-circuits between the two conductive end portions 42e and 42f of the etched coil conductors. The planar substrate-supported continuous-spiral conductor has a middle portion 42 of elongated conductive strips 21 separated by cutlines 22. One conductor-end interconnection region 42f is used; it is the region which will become the "flap" on the outside of the cylindrical coil when the etched circuit board 40 s rolled. Region 42f contains the conductive interconnectors 30-1 through 30-n required for connecting the symmetrically-disposed ends of each pair of conductive strips 21-ib and 21-ic. The opposite coil end portion 42e has a different end pattern etched therein, which pattern is the subtractive inverse of the other coil end-turn pattern 42f and is selected to allow essential cancellation of the end turn magnetic fields by having the Z component of current in the end turns cancel one another while leaving the desired $\theta$ current component of interest. Each of the conductors 50-1 through 50-n of the other end 42e is thus the combination of the elongated conductive strip 21, in the Z direction, with the "semi-oval" pattern of the like-lettered, associated first end interconnector 30-1 through 30-n subtracted therefrom. The current distribution, and conductor pattern at end region 42e may be best be understood by reference to FIG. 3b, wherein the elongated linear conductor strips 21 appear in the leftward portion, and the selected end-turn return paths 30 appear in the center portion. By subtracting this turn current distribution (conductors 30) from the desired elongated strip current distribution (conductors 21), the resultant current pattern 40, at the right of the figure, is obtained for etching into the opposite coil end. The net result, when end-turn conductors 30 are overlapped about the conductive region 42e, is that the axial components in conductor 30 and 50 cancel while the angular $\theta$ components sum to the desired value.

While several presently preferred embodiments of our novel etched Z-axis gradient coils have been described in detail herein, many modifications and variations will now become apparent to those skilled in the art. It is our intent, therefore, to be limited only by the scope of the appending claims and not by the specific details and instrumentalities presented by way of explanation herein.

What is claimed is:

1. An etched coil for producing a Z-axis magnetic field gradient responsive to flow of a current I, comprising:
   a plurality N of pairs of elongated conductive strips, each strip of a pair being positioned substantially symmetrically about a central insulative cutline, and insulatively spaced from all other strips, with a first strip being insulatively severed into first and third strip portions;
   conductive means for enabling said current to flow into a first one of said strips and then between each successive pair of said strips, until said current flows out of a last one of said strips;
   first means for interconnecting, in each i-th pair, where $1 \leq i \leq N$, a first (v-th) end iv of a first strip of that pair to a substantially-symmetrically disposed first (w-th) end iw of a second strip of that pair; and
   second means for interconnecting, in each i-th pair, a second (y-th) end iv of the second strip of that pair to a substantially-symmetrically disposed (z-th) end iz of the third portion of that pair;
   said first and second interconnecting means, when said strips are rolled into a substantially cylindrical form with said iv end adjacent to said iz end and said iw end adjacent to said iv end, being positioned adjacent to one another and radially disposed to overlap in the $\theta$ direction of the resulting coil, and with a magnetic field due to flow of said current in any one of said first interconnecting means being substantially cancelled by another magnetic field due to flow of the same current in a corresponding one of said second interconnecting means.

2. The coil of claim 1, wherein each of said first and second interconnecting means comprise a set of a plurality N of arcuate interconductors.

3. The coil of claim 2, wherein each end of each portion of the strips is integrally joined to one of an adjacent strip end or one end of an associated interconductor.

4. The coil of claim 3, wherein the sets of interconnectors are mirror images of one another.

5. The coil of claim 4, wherein each arcuate interconnector is a portion of a circle.

6. The coil of claim 4, wherein each arcuate interconnector is a portion of an ellipse.

7. The coil of claim 1, wherein the coil extends in the axial (z) direction between limits of $\pm Z_1$, and each strip has a current density J given by $$J_\theta(\theta,z) = \frac{2NIz}{(1+b)z_1^2}\left(1 + \frac{3}{2}b\left|\frac{z}{z_1}\right|\right)$$

where b is a dimensionless parameter whose value determines the ratio of linear to quadratic increasing current density.

8. The coil of claim 7, wherein b is about 3.28 and the number N of strip pairs is about 18.

9. The coil of claim 1, further comprising a second etched coil as part of a set o self-shielded gradient coils.

10. The coil of claim 1, further comprising a flexible insulative substrate supporting at least a portion of the conductive strips and interconecting means.

11. The coil of claim 10, further comprising an additional insulative member between the conductive strips and the interconnecting means radially lapped thereover.

12. The coil of claim 1, wherein the first interconnecting means comprises a first set of arcuately-shaped interconnectors, and the second interconnecting means comprises a second set of interconnectors each with a shape which is the subtractive inverse of an associated interconnector of the first set.

13. The coil of claim 12, wherein the second interconnector set is positioned radially inward of the first interconnector set when the cylindrical coil is formed.

14. The coil of claim 12, wherein each arcuate interconnector is a portion of a circle.

15. The coil of claim 12, wherein each arcuate interconnector is a portion of an ellipse.

16. The col of claim 12, wherein the second set of interconnectors has an overall rectangular periphery at an end furthest from the first interconnector set.

17. The coil of claim 12, wherein the coil extends in the axial (z) direction between limits of $\pm Z_1$, and each strip has a current density J given by $$J_\theta(\theta,z) = \frac{2NIz}{(1+b)z_1^2}\left(1 + \frac{3}{2}b\left|\frac{z}{z_1}\right|\right)$$

where b is a dimensionless parameter whose value determines the ratio of linear to quadratic increasing current density.

18. The coil of claim 17, wherein b is about 3.28 and the number N of strip pairs is about 18.

19. The coil of claim 12, further comprising a second etched coil as part of a set of self-shielded gradient coils.

* * * * *